(12) United States Patent
Sun

(10) Patent No.: US 10,043,433 B2
(45) Date of Patent: Aug. 7, 2018

(54) PIXEL STRUCTURE AND DISPLAYING METHOD THEREOF, AND RELATED DISPLAY APPARATUS

(71) Applicant: BOE TECHNOLOGY GROUP CO., LTD, Beijing (CN)

(72) Inventor: Liang Sun, Beijing (CN)

(73) Assignee: BOE TECHNOLOGY GROUP CO., LTD, Beijing (CN)

( * ) Notice: Subject to any disclaimer, the term of this patent is extended or adjusted under 35 U.S.C. 154(b) by 72 days.

(21) Appl. No.: 15/032,160

(22) PCT Filed: Aug. 14, 2015

(86) PCT No.: PCT/CN2015/087027
§ 371 (c)(1),
(2) Date: Apr. 26, 2016

(87) PCT Pub. No.: WO2016/107188
PCT Pub. Date: Jul. 7, 2016

(65) Prior Publication Data
US 2016/0343284 A1    Nov. 24, 2016

(30) Foreign Application Priority Data

Dec. 30, 2014  (CN) .......................... 2014 1 0842321

(51) Int. Cl.
*H01L 27/32* (2006.01)
*G09G 3/20* (2006.01)
(Continued)

(52) U.S. Cl.
CPC ......... *G09G 3/2003* (2013.01); *G09G 3/2074* (2013.01); *G09G 3/3225* (2013.01);
(Continued)

(58) Field of Classification Search
CPC ............... H01L 51/0011; H01L 51/001; H01L 27/3216; H01L 27/3218; G09G 3/3225;
(Continued)

(56) References Cited

U.S. PATENT DOCUMENTS 4,458,175 A * 7/1984 Weekley .................. B41M 1/16
313/470
5,124,695 A * 6/1992 Green ............... G02F 1/134336
345/103

(Continued)

FOREIGN PATENT DOCUMENTS

| CN | 101645492 | 2/2010 |
| CN | 102354702 A | 2/2012 |

(Continued)

OTHER PUBLICATIONS

State Intellectual Property Office of the P.R.C. (SIPO) Office Action 1 for 201410842321.6 dated Dec. 5, 2016 11 Pages.

(Continued)

*Primary Examiner* — Christopher E Leiby
(74) *Attorney, Agent, or Firm* — Anova Law Group, PLLC

(57) ABSTRACT

The present disclosure provides a pixel structure. The pixel structure includes first sub-pixels, second sub-pixels, and third sub-pixels. Two adjacent third sub-pixels facing each other form a third sub-pixel group. The second sub-pixels are arranged in a row along a first axis to form second-sub-pixel rows, the first sub-pixels and the third sub-pixel groups are arranged in an alternating configuration along the direction of the first axis parallel to the second-sub-pixel rows, and the second-sub-pixel rows and rows formed by the first sub-pixels and the third sub-pixel groups are arranged in an alternating configuration. The second sub-pixels are arranged along a direction of a second axis to form second-sub-pixel columns, the first sub-pixels and the third sub-
(Continued)

pixel groups are arranged in an alternating configuration along the direction of the second axis parallel to the second-sub-pixel columns, the second-sub-pixel columns and columns are arranged in an alternating configuration.

18 Claims, 8 Drawing Sheets

(51) Int. Cl.
    *G09G 3/3225*     (2016.01)
    *G09G 3/36*     (2006.01)
    *H01L 51/00*     (2006.01)

(52) U.S. Cl.
    CPC ....... *G09G 3/3607* (2013.01); *H01L 27/3216* (2013.01); *H01L 27/3218* (2013.01); *H01L 51/001* (2013.01); *H01L 51/0011* (2013.01); *G02F 2201/52* (2013.01); *G09G 2300/0452* (2013.01); *G09G 2300/0465* (2013.01); *G09G 2320/0233* (2013.01); *G09G 2320/043* (2013.01); *G09G 2360/147* (2013.01)

(58) Field of Classification Search
    CPC .. G09G 3/2074; G09G 3/2003; G09G 3/3607; G09G 2300/0465; G09G 2300/0452; G09G 2360/147; G09G 2320/043; G09G 2320/0233; G02F 2201/52
    See application file for complete search history.

(56) References Cited

U.S. PATENT DOCUMENTS

| | | | | |
|---|---|---|---|---|
| 5,461,503 | A * | 10/1995 | Deffontaines | G02F 1/133514 349/109 |
| 5,579,027 | A * | 11/1996 | Sakurai | G09G 3/3607 345/100 |
| 5,805,136 | A * | 9/1998 | Silverbrook | G02F 1/134336 345/43 |
| 6,023,315 | A * | 2/2000 | Harrold | G02B 27/2214 348/E13.004 |
| 6,469,766 | B2 * | 10/2002 | Waterman | G02F 1/134336 349/144 |
| 6,714,206 | B1 * | 3/2004 | Martin | G09G 3/2003 345/589 |
| 6,903,754 | B2 * | 6/2005 | Brown Elliott | G09G 3/3607 345/589 |
| 7,230,584 | B2 * | 6/2007 | Elliott | H04N 9/3114 345/32 |
| 7,283,142 | B2 * | 10/2007 | Credelle | G09G 3/20 345/589 |
| 8,330,352 | B2 * | 12/2012 | Sung | H01L 27/3216 313/504 |
| 8,598,784 | B2 * | 12/2013 | Ko | H01L 27/3216 313/1 |
| 8,716,929 | B2 * | 5/2014 | Yoo | H01L 27/3213 313/500 |
| 9,431,469 | B2 * | 8/2016 | Park | H01L 51/525 |
| 9,472,146 | B2 * | 10/2016 | Yang | G09G 3/3648 |
| 9,508,285 | B2 * | 11/2016 | Matsueda | G09G 3/3208 |
| 9,536,482 | B2 * | 1/2017 | Yang | G09G 3/3607 |
| 9,638,951 | B2 * | 5/2017 | Wang | G02F 1/133514 |
| 9,666,652 | B2 * | 5/2017 | Madigan | H01L 27/3246 |
| 2002/0014837 | A1 * | 2/2002 | Kim | H01L 27/329 313/505 |
| 2003/0103058 | A1 * | 6/2003 | Hellen Brown Elliott | G09G 3/20 345/589 |
| 2003/0128225 | A1 * | 7/2003 | Credelle | G02F 1/133514 345/694 |
| 2003/0218618 | A1 * | 11/2003 | Phan | G09G 3/2074 345/629 |
| 2004/0051724 | A1 * | 3/2004 | Elliott | G02F 1/133514 345/694 |
| 2004/0080696 | A1 * | 4/2004 | Kanazawa | G02F 1/133514 349/130 |
| 2004/0125278 | A1 * | 7/2004 | Park | G02F 1/133514 349/106 |
| 2004/0196297 | A1 * | 10/2004 | Elliott | G06F 3/14 345/613 |
| 2005/0001542 | A1 * | 1/2005 | Kiguchi | H01L 27/3216 313/504 |
| 2005/0087740 | A1 * | 4/2005 | Matsumoto | H01L 27/3218 257/72 |
| 2007/0002084 | A1 * | 1/2007 | Kimura | G09G 3/3241 345/694 |
| 2008/0001525 | A1 * | 1/2008 | Chao | H01L 27/3216 313/500 |
| 2009/0103022 | A1 * | 4/2009 | Roh | G02F 1/133514 349/106 |
| 2009/0302331 | A1 * | 12/2009 | Smith | H01L 27/3218 257/88 |
| 2010/0026173 | A1 | 2/2010 | Lhee et al. | |
| 2011/0012820 | A1 * | 1/2011 | Kim | G09G 3/3208 345/82 |
| 2011/0260951 | A1 | 10/2011 | Hwang et al. | |
| 2012/0056531 | A1 * | 3/2012 | Park | H01L 51/5036 313/506 |
| 2013/0234917 | A1 | 9/2013 | Lee | |
| 2016/0027376 | A1 | 1/2016 | Chen | |
| 2016/0343284 | A1 | 11/2016 | Sun | |
| 2017/0148365 | A1 * | 5/2017 | Xi | G09G 3/2003 |
| 2017/0179206 | A1 * | 6/2017 | Lee | H01L 27/3218 |

FOREIGN PATENT DOCUMENTS

| | | |
|---|---|---|
| CN | 103715227 | 4/2014 |
| CN | 103715227 A | 4/2014 |
| CN | 104269411 A | 1/2015 |
| CN | 104465714 A | 3/2015 |
| CN | 104466007 A | 3/2015 |
| CN | 104538418 A | 4/2015 |
| EP | 2151866 B1 | 4/2014 |
| JP | 2010040529 A | 2/2010 |
| KR | 20110117612 A | 10/2011 |
| KR | 20140035239 A | 3/2014 |

OTHER PUBLICATIONS

The World Intellectual Property Organization (WIPO) International Search Report for PCT/CN2015/087027 dated Dec. 1, 2015.
Korean Intellectual Property Office (KIPO) Office Action 1 for 20167033680 dated Dec. 19, 2017 16 Pages. (including translation).

* cited by examiner

PIXEL STRUCTURE AND DISPLAYING METHOD THEREOF, AND RELATED DISPLAY APPARATUS

CROSS-REFERENCES TO RELATED APPLICATIONS

This application is a national phase entry under 35 U.S.C § 371 of International Application No. PCT/CN2015/087027, filed on Aug. 14, 2015, which claims priority to Chinese Patent Application No. 201410842321.6, filed on Dec. 30, 2014. The above enumerated patent applications are incorporated by reference herein in their entirety.

FIELD OF THE INVENTION

The present invention generally relates to the display technologies and, more particularly, relates to a pixel structure and related displaying method thereof, and a display apparatus containing the same.

BACKGROUND

Flat display apparatuses generally include LCD (Liquid Crystal Display) apparatuses and OLED (Organic Light-Emitting Diode) display apparatuses. Particularly, compared to an LCD, an OLED display has advantages such as being self-luminous, having faster response, and providing a wider viewing angle. OLED displays are often suitable for flexible displays, transparent displays, three-dimensional displays, and many other display applications.

Currently, an FMM (Fine Metal Mask) is often applied in the process to manufacture top-emitting AMOLED (Active Matrix Organic Light-Emitting Diode) display panels. The FMM is often used in a deposition process for forming the organic light-emitting layer. In general, the opening size of the FMM is often subjected to a restriction of minimum opening size. In the deposition process, a distance between sub-pixels for displaying a same color may be subjected to certain restrictions such that the distance between two sub-pixels for displaying one color may be different from the distance between two sub-pixels for displaying another color. As a result, the manufacturing of AMOLED display panels may be inevitably limited by the opening size of the FMM and precision of the deposition process. It might be difficult to obtain high resolution. Particularly, it may difficult to obtain the aperture ratio of the sub-pixels required for providing high resolutions. The aperture ratio of the display panel may further affect the product lifespan, display brightness, etc.

BRIEF SUMMARY OF THE DISCLOSURE

The present invention addresses the above problems in the prior art. The present disclosure provides a pixel structure, a method for displaying the pixel structure, and a display apparatus containing the pixel structure. The pixel structure can realize high resolution and improve the aperture ratio of the sub-pixels to obtain desirable display brightness. The present disclosure thus simplifies the manufacturing process and extends/improves the product service time of the display panels.

One aspect of the present disclosure provides a pixel structure. The pixel structure includes first sub-pixels, second sub-pixels, and third sub-pixels. Two adjacent third sub-pixels facing each other form a third sub-pixel group. The second sub-pixels are arranged in a row along a first axis to form second-sub-pixel rows, the first sub-pixels and the third sub-pixel groups are arranged in an alternating configuration along the direction of the first axis parallel to the second-sub-pixel rows, and the second-sub-pixel rows and rows formed by the first sub-pixels and the third sub-pixel groups are arranged in an alternating configuration. The second sub-pixels are arranged along a direction of a second axis to form second-sub-pixel columns, the first sub-pixels and the third sub-pixel groups are arranged in an alternating configuration along the direction of the second axis parallel to the second-sub-pixel columns, the second-sub-pixel columns and columns formed by the first sub-pixels and the third sub-pixel groups are arranged in an alternating configuration. Geometric center of each second sub-pixel is positioned on a perpendicular bisection of a line connecting centers of any two of third sub-pixel groups and first sub-pixels adjacent to the second sub-pixel.

Optionally, the second sub-pixel, an adjacent third sub-pixel group in an adjacent row, and an adjacent first sub-pixel in the adjacent row form a pixel unit, consecutive pixel units form pixel unit rows aligned along the direction of the row axis, and except for a first or a last pixel unit in an odd and/or even pixel unit row (e.g., at the edge of a pixel unit row), each pixel unit shares the first sub-pixel with an adjacent pixel unit in a same pixel unit row.

Optionally, the second sub-pixel, an adjacent third sub-pixel group in an adjacent column, and an adjacent first sub-pixel in the adjacent column form a pixel unit, consecutive pixel units form pixel unit columns aligned along the direction of the column axis; and except for a first or a last pixel unit in an odd or even pixel unit column, each pixel unit shares the first sub-pixel with an adjacent pixel unit in a same pixel unit column.

Optionally, geometric centers of the first sub-pixels in consecutive rows and consecutive columns are aligned to form lines along a diagonal direction different from the directions of the row axis and the direction of the column axis. Geometric centers of the third sub-pixel groups in consecutive rows and consecutive columns are aligned to form lines along the diagonal direction to be parallel to lines formed by the geometric centers of the first sub-pixels such that the lines formed by the geometric centers of the first sub-pixels and lines formed by the geometric centers of third sub-pixel groups are arranged in an alternating configuration, wherein the diagonal direction is 45 degrees clockwise or counter clockwise with the direction of the row axis or the direction of the column axis. Each second sub-pixel is aligned between two adjacent first sub-pixels and two adjacent third sub-pixel groups, wherein the two adjacent first sub-pixels are aligned in the diagonal direction and the two adjacent third sub-pixel groups are aligned in the diagonal direction. A geometric center of each second sub-pixel is arranged at an intersection of a perpendicular bisector of a line connecting geometric centers of adjacent first sub-pixel and third sub-pixel group in an adjacent row and a perpendicular bisector of a line connecting geometric centers of adjacent first sub-pixel and third sub-pixel group in an adjacent column.

Optionally, each of the two third sub-pixels in the third sub-pixel group is a mirror image of the other along the direction of the row axis or along the direction of the column axis, each third sub-pixel group are arranged between two first sub-pixels along the direction of the row axis or along the direction of the column axis, and two adjacent third sub-pixels are arranged on both sides of the first sub-pixel, wherein each of the two adjacent third sub-pixels has a shortest distance to the first sub-pixel along the direction of the row axis or along the direction of the column axis such that the two adjacent third sub-pixels have a mirror symmetry or a centrosymmetry about a geometric center of the first sub-pixel.

Optionally, each third sub-pixel group is arranged between two adjacent second sub-pixels along a diagonal direction such that each second sub-pixel is arranged between two adjacent third sub-pixel groups along the diagonal direction, and the two adjacent third sub-pixel groups have a mirror symmetry or a centrosymmetry about a geometric center of the second sub-pixel.

Optionally, a shape of the first sub-pixel, a shape of the third sub-pixel group, and a shape of the second sub-pixel each has a symmetry axis; and a symmetry axis of the shape of the first sub-pixel extends along a direction parallel to one of the row axis, column axis, and diagonal axis, a symmetry axis of the shape of the third sub-pixel group extends along a direction parallel to one of the row axis, column axis, and diagonal axis, and a symmetry axis of the shape of the second sub-pixel extends along a direction parallel to one of the row axis, column axis, and diagonal axis.

Optionally, the lines formed by the geometric centers of the first sub-pixels are arranged along a direction of 45 degrees or 135 degrees with the row axis, the lines formed by the geometric centers of the third sub-pixel groups are arranged along a direction of 45 degrees or 135 degrees with the row axis; and the lines formed by the geometric centers of the second sub-pixels are arranged along a direction of 45 degrees or 135 degrees with the row axis.

Optionally, each of the shape of the first sub-pixel, the shape of the third sub-pixel, the shape of the third sub-pixel group, and the shape of the second sub-pixel is a circular shape, a triangular shape, a quadrilateral shape, a pentagonal shape, a hexagonal shape, an octagonal shape, or a combination thereof.

Optionally, the first sub-pixel has a quadrilateral shape or an octagonal shape; the third sub-pixel has a triangular shape or a quadrilateral shape such that the third sub-pixel group formed by two adjacent third sub-pixels facing each other has a quadrilateral shape or an octagonal shape; and the second sub-pixel has a quadrilateral shape or an octagonal shape.

Optionally, the first sub-pixel has a rhombus shape, the third sub-pixel has a rectangular shape such that the third sub-pixel group formed by two adjacent third sub-pixels facing each other has an overall quadrilateral shape, and the second sub-pixel has a rectangular shape.

Optionally, the first sub-pixel has a rhombus shape; the third sub-pixel has an isosceles triangle shape such that the third sub-pixel group formed by two adjacent third sub-pixels facing each other has an overall rhombus shape, and the second sub-pixel has a rectangular shape.

Optionally, turning angles of the quadrilateral shape and the octagonal shape are chamfered.

Optionally, two adjacent second sub-pixels having a closest distance along the direction of the row axis or the direction of the column axis have same shapes.

Optionally, two adjacent second sub-pixels having a closest distance along the direction of the row axis or the direction of the column axis have a mirror symmetry about a perpendicular bisector of a line connecting geometric centers of the two adjacent second sub-pixels.

Optionally, geometric centers of the first sub-pixels in one row or in one column are aligned in a straight line, geometric centers of the third sub-pixel groups in one row or in one column are aligned in a straight line, and geometric centers of the second sub-pixels in one row or in one column are aligned in a straight line.

Optionally, an area of the first sub-pixel is same as an area of the third sub-pixel group, and an area of the second sub-pixel is less than the area of the first sub-pixel.

Optionally, an area of the third sub-pixel group is greater than an area of the first sub-pixel, and the area of the first sub-pixel is greater than an area of the second sub-pixel.

Optionally, geometric centers of the first sub-pixels, geometric centers of the second sub-pixels, and geometric centers of the third sub-pixel groups are distributed uniformly.

Optionally, the first pixels display a red color or a blue color, the second sub-pixels display a green color, and the third sub-pixel groups display a blue color or a red color.

Optionally, each of the first sub-pixel, the second sub-pixel, and the third sub-pixel group is connected to a data line to receive pixel display information.

Optionally, the second sub-pixel, an adjacent third sub-pixel in an adjacent row, and an adjacent first sub-pixel in the adjacent row form a pixel unit, consecutive pixel units form pixel unit rows aligned along the direction of the row axis; and except for a first or a last pixel unit in an odd or even pixel unit row, each pixel unit shares the first sub-pixel with an adjacent pixel unit in a same pixel unit row such that each pixel unit displays pixel display information of three display colors.

Optionally, the second sub-pixel, an adjacent third sub-pixel in an adjacent column, and an adjacent first sub-pixel in the adjacent column form a pixel unit, consecutive pixel units form pixel unit columns aligned along the direction of the column axis, and except for a first or a last pixel unit in an odd or even pixel unit column, each pixel unit shares the first sub-pixel with an adjacent pixel unit in a same pixel unit column such that each pixel unit displays pixel display information of the three display colors.

Optionally, the method further includes steps S1 to S3, wherein: in step S3, the pixel structure obtains theoretical brightness values from the pixel display information for colors displayed by the first sub-pixel, the second sub-pixel, and the third sub-pixel of each pixel unit; in step S2, the pixel structure calculates actual brightness values of the first sub-pixel, the second sub-pixel, and the third sub-pixel 30 of each pixel unit; and in step S3, the pixel structure inputs corresponding actual brightness values into the first sub-pixel, the second sub-pixel, and the third sub-pixel of each pixel unit to display images.

Optionally, the actual brightness value of the color displayed by the second sub-pixels is a brightness value of color displayed by the second sub-pixel; the actual brightness value of the color displayed by the third sub-pixel is a brightness value of displayed by the third sub-pixel; and the actual brightness value of the color displayed by the first sub-pixel is calculated as a sum of a weighted brightness value of color displayed by a first portion of the first sub-pixel and a weighted brightness value of color displayed by a second portion of the first sub-pixel, wherein the first portion of the first sub-pixel is in one pixel unit and the second portion of the first sub-pixel is another pixel unit adjacent to the one pixel unit.

Optionally, a relative weight value multiplied by the brightness value of the color displayed by the first portion of the first sub-pixel is ½, and a relative weight value multiplied by the brightness value of the color displayed by the second portion of the first sub-pixel is ½.

Another aspect of the present disclosure provides a displaying apparatus. The display apparatus incorporates the pixel structure provided in the present disclosure. The pixel structure includes first sub-pixels, second sub-pixels, and third sub-pixels, wherein the two adjacent third sub-pixels facing each other form a third sub-pixel group, the second sub-pixels are arranged in a row to form second-sub-pixel rows, the first sub-pixels and the third sub-pixel groups are arranged in an alternating configuration along the direction of the row axis, and the second-sub-pixel rows and rows formed by the first sub-pixels and the third sub-pixel groups are arranged in an alternating configuration along the direction of the row axis. The second sub-pixels are arranged along a direction of a column axis to form second-sub-pixel columns, the first sub-pixels and the third sub-pixel groups are arranged in an alternating configuration along the direction of the column axis, the second-sub-pixel columns and columns formed by the first sub-pixels and the third sub-pixel groups are arranged in an alternating configuration along the direction of the column axis. Geometric center of each second sub-pixel is positioned on a perpendicular bisection of a line connecting centers of any two of adjacent third sub-pixel groups and first sub-pixels.

Optionally, the display apparatus is an OLED display device, an LCD device, or a combination thereof.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

One aspect of the present disclosure provides a pixel structure.

Figure 1:
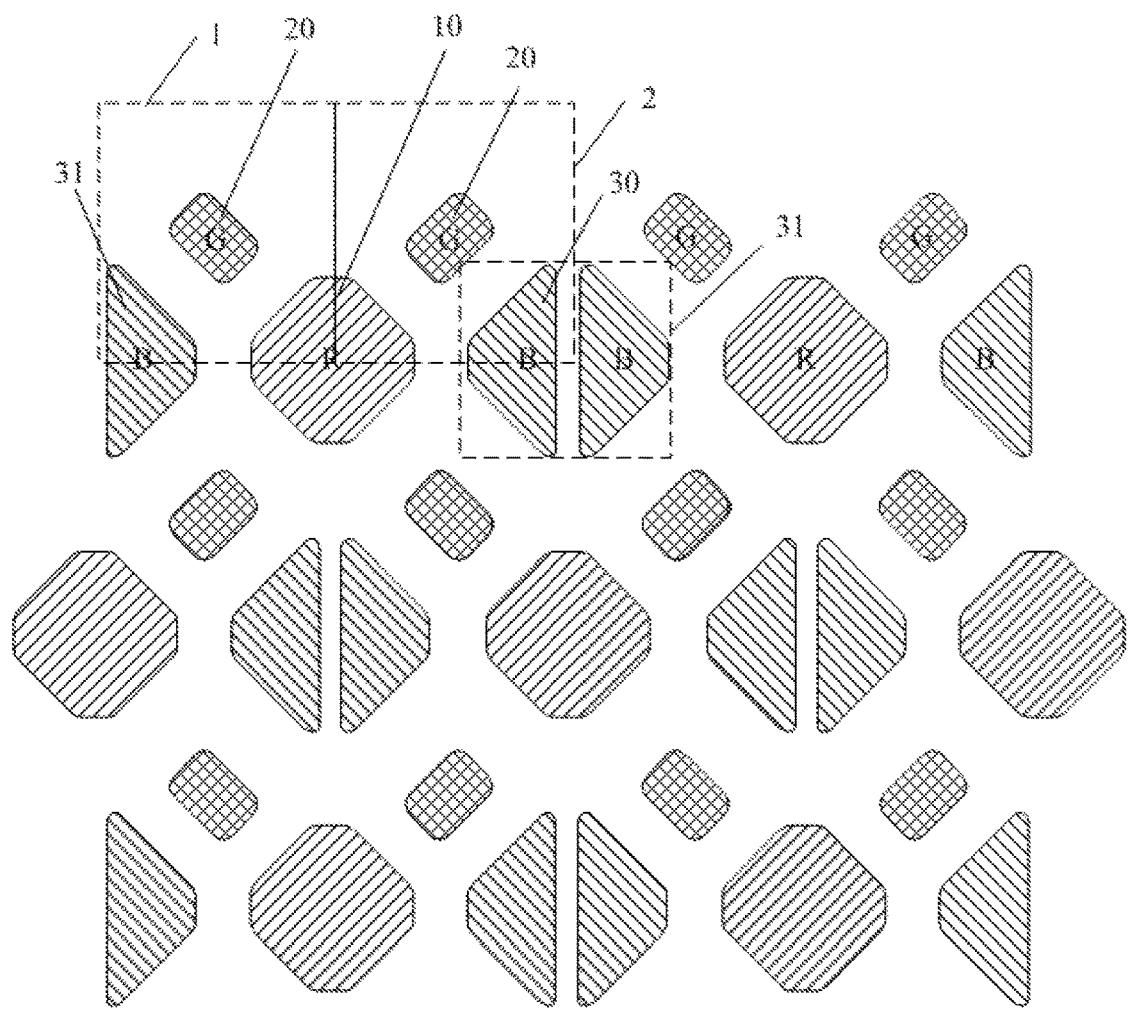
FIG. 1 illustrates schematics of an exemplary pixel structure in one embodiment of the present disclosure according to the disclosed embodiments.

As shown in FIG. 1, the pixel structure provided in the present disclosure includes first sub-pixels 10, second sub-pixels 20, and third sub-pixels 30. Two opposing adjacent third sub-pixels 30 may be arranged to face each other and form a third sub-pixel group 31. The second sub-pixels 20 may be aligned in a row (e.g., the horizontal direction) to form second-sub-pixel rows. The first sub-pixels 10 and the third sub-pixel groups 31 may be arranged in an alternating configuration in a row, e.g., one first sub-pixel 10 may be arranged between two third sub-pixel groups 31, and vice versa. The second-sub-pixels rows and the rows formed by the first sub-pixels 10 and the third sub-pixel groups 31 may be arranged in an alternating configuration, e.g., one second-sub-pixel row may be arranged between two rows formed by the first sub-pixels 10 and the third sub-pixel groups 31, and vice versa.

The two opposing adjacent third sub-pixels 30 may refer to the two adjacent third sub-pixels 30 arranged facing/opposing each other along a direction of the vertical axis between the two third sub-pixels 30. The two third sub-pixels 30 may have the closest distance in between. The sizes and shapes of the two third sub-pixels 30 may be substantially the same. The two third sub-pixels 30 may also have mirror symmetry, i.e., one of the third sub-pixel 30 is the mirror image of the other third sub-pixel 30. For example, if the two third sub-pixels 30 both move toward the center (along the horizontal axis in FIG. 1) of the two third sub-pixels 30, the two third sub-pixels 30 may form a pattern with matching boundaries.

It is noted that, according to certain manufacturing or design requirements, the two third sub-pixels 30 for forming a third sub-pixel group 31 may also have different shapes and/or different sizes. For example, one third sub-pixel 30 may have a greater size than the other third sub-pixel 30. Also, the two third sub-pixels 30 may have similar overall shapes but may differentiate each other in some areas. For example, certain areas of the two third sub-pixels 30 may have been removed or modified such that the two third sub-pixels 30 may have similar overall shapes but different shapes in certain areas. Other reasons may also cause the two third sub-pixels 30 to have overall similar shapes but different shapes in certain areas. The two third sub-pixels 30 with the features described above are also suitable for the manufacturing/designing of the third sub-pixels 30 for forming the third sub-pixel group 31.

The second sub-pixels 20 may be aligned as second-sub-pixel columns (along the direction of a column axis). The first sub-pixels 10 and the third sub-pixel groups 31 may be arranged in an alternating configuration in columns. For example, one first sub-pixel 10 may be arranged between two third sub-pixel groups 31 in a column, and vice versa. The second-sub-pixel columns and the columns formed by the first sub-pixels 10 and the third sub-pixel groups 31 may be arranged in an alternating configuration. For example, one second-sub-pixel column may be arranged between two columns formed by the first sub-pixels 10 and the third sub-pixel groups 31, and vice versa. The geometric center of a second sub-pixel 20 may be positioned on the perpendicular bisector of a line connecting the geometric centers of any two of the adjacent first sub-pixels 10 and third sub-pixel groups 31 (i.e., two first sub-pixels 10 and two third sub-pixel groups 31). The perpendicular bisector may refer to the line perpendicular to and passing through the midpoint of the line connecting the geometric centers of the two first sub-pixels 10/third sub-pixel groups 31. For example, the geometric center of a second sub-pixel 20 may be positioned on the perpendicular bisector of the line connecting the adjacent first sub-pixel 10 and third sub-pixel group 31 in the row above the second sub-pixel 20.

Meanwhile, the geometric center of the second sub-pixel 20 may be positioned on the perpendicular bisector of the line connecting the geometric centers of the adjacent first sub-pixel 10 and third sub-pixel group 31 in the row below the second sub-pixel 20. Also, the geometric center of the second sub-pixel 20 may be positioned on the perpendicular bisector of the line connecting the geometric centers of the two adjacent first sub-pixels 10. Further, the geometric center of the second sub-pixel 20 may be positioned on the perpendicular bisector of the line connecting the geometric centers of the adjacent first sub-pixel 10 and the adjacent third sub-pixel group 31 aligned along the column axis. Each of the adjacent first sub-pixels 10 may be positioned in a diagonal direction with respect to the second sub-pixel 20. For example, as shown in FIG. 1, the line connecting the geometric center of the second sub-pixel 20 and either one of the adjacent first sub-pixels 10 may have an angle of 45 degrees clockwise or 135 degrees counter clockwise with respect to the direction of the row axis. Meanwhile, the geometric center of the second sub-pixel 20 may be positioned on the perpendicular bisector of the line connecting the geometric centers of the two adjacent third sub-pixel groups 31, where each of the adjacent third sub-pixel groups 31 may be positioned in a diagonal direction with respect to the second sub-pixel 20. For example, as shown in FIG. 1, the line connecting the geometric center of the second sub-pixel 20 and either one of the adjacent third sub-pixel groups 31 may have an angle of 45 degrees clockwise or 135 degrees counter clockwise with respect to the direction of the row axis.

It should be noted that, due to limitations in manufacturing conditions, the positions or relative positions of the sub-pixels may not precisely satisfy the requirements described above. Reasonable deviations, such as angle deviations less than 10 degrees, and/or distance error less than 10%, are all within the scope of the present disclosure.

Meanwhile, along the direction of the row axis, the two second sub-pixels 20 with the closest distance may have the same shapes and each may be a mirror image of the other. Each of the two third sub-pixels 30 in one third sub-pixel group 31, positioned between two first sub-pixels 10, may be a mirror image of the other along the direction of the row axis or along the direction of the column axis. One third sub-pixels 30 positioned on one side of a first sub-pixel 10 may be a mirror image of the other third sub-pixel 30 on the other side of the first sub-pixel 10 along the direction of the row axis or along the direction of the column axis. The two adjacent third sub-pixels 30 facing/opposing each other along the direction of the row axis may form a third sub-pixel group 31.

Figure 2:
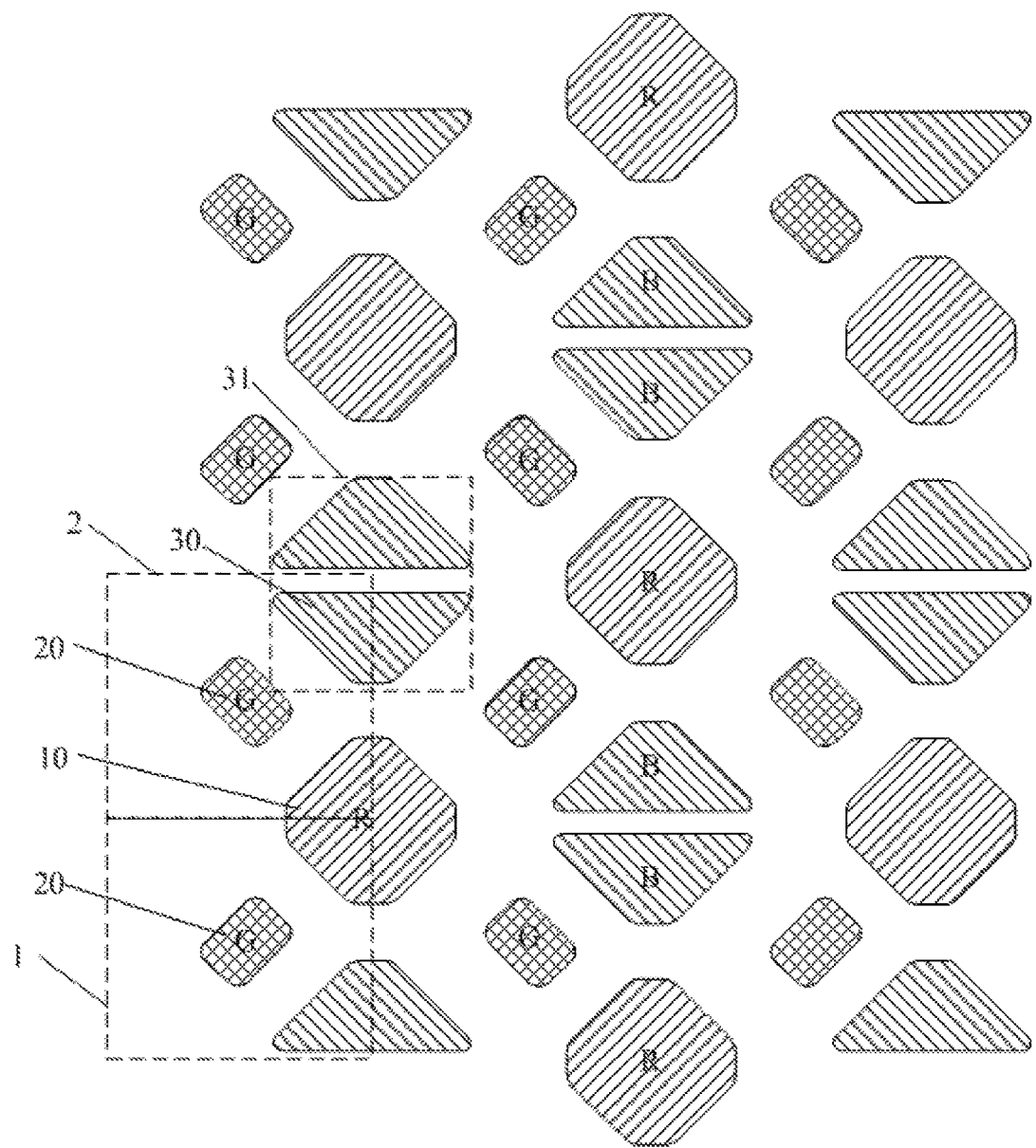
FIG. 2 illustrates schematics of the pixel structure of FIG. 1 with a rotation angle of 90 degrees according to the disclosed embodiments.

In certain embodiments, the pixel structure of FIG. 1 may be rotated for 90 degrees to form the pixel structure of FIG. 2. In FIG. 2, along the direction of the column axis, the two second sub-pixels 20 with the closest distance may have the same shapes and each may be a mirror image of the other. The two adjacent third sub-pixels 30 facing/opposing each other along the direction of the column axis may form a third sub-pixel group 31.

Figure 3:
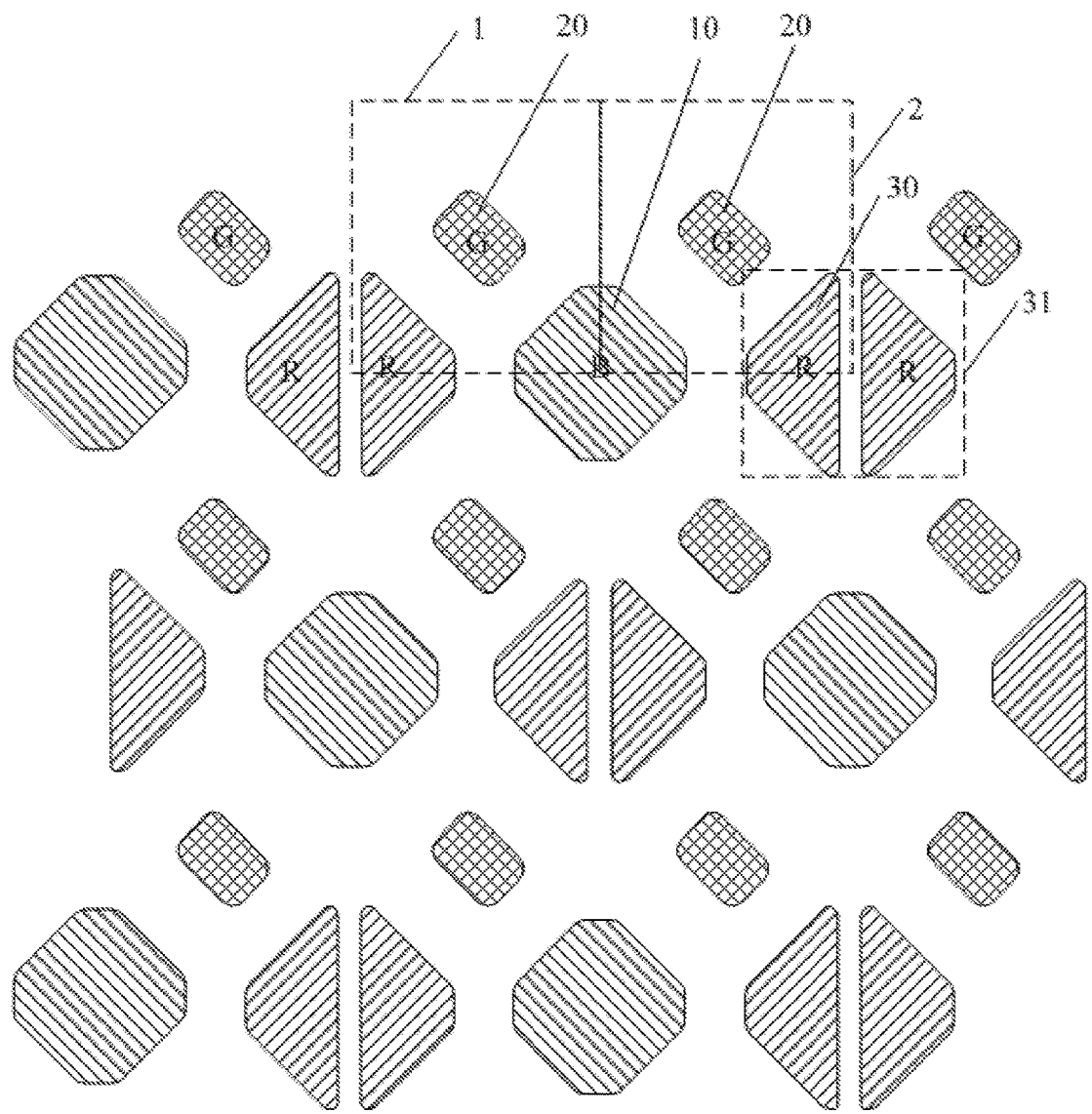
FIG. 3 illustrates schematics of another arrangement of the second sub-pixel of the pixel structure of FIG. 1 according to the disclosed embodiments.

In certain embodiments, the arrangement of the second sub-pixels 20 in the pixel structure of FIG. 1 can be adjusted or modified. As shown in FIG. 3, the two adjacent second sub-pixels 20 may have the same shapes, and a second sub-pixel 20 may be positioned along a diagonal direction with respect to the adjacent first sub-pixels 10 and third sub-pixel groups 31. A second sub-pixel 20 with the closest distant to the second sub-pixel 20 along the diagonal direction may have the same orientation and relative position with respect to the adjacent first sub-pixels 10 and third sub-pixel groups 31. It is understandable that, in certain embodiments, the pixel structure of FIG. 3 may also be rotated for 90 degrees to form a new pixel structure. Details for rotating the pixel structure of FIG. 3 are omitted herein.

Embodiments are now illustrated in detail in light of the pixel units in FIG. 1 to describe the arrangement of the pixel structure and the method for displaying the pixel structure. Referring to FIG. 1, a pixel unit may include a second sub-pixel 20, an adjacent third sub-pixel 30 in a row adjacent to the second sub-pixel 20, and an adjacent first sub-pixel 10 in the row adjacent to the second sub-pixel 20. Same working principle and method for displaying the pixel structure can be applied on a plurality of embodiments such as the rotated pixel structure as shown in FIG. 2, and the pixel structure with a different arrangement of the second sub-pixels 20 as shown in FIG. 3. The same working principle and method for displaying can also be applied on the pixel structure with third sub-pixels 30 of a different shape in FIG. 4, and the pixel structure with sub-pixels for displaying different colors as shown in FIG. 5.

According to the Trichromatic Theory of color vision, the three primary colors (i.e., red (R), green (G), and blue (B) colors) can be mixed with appropriate intensities to display different colors. A second sub-pixel 20, an adjacent third sub-pixel 30 in a row adjacent to the second sub-pixel 20, and an adjacent first sub-pixel 10 in the row adjacent to the second sub-pixel 20 may form a pixel unit. Alternatively, a second sub-pixel 20, an adjacent third sub-pixel 30 in a column adjacent to the second sub-pixel 20, and an adjacent first sub-pixel 10 in the column adjacent to the second sub-pixel 20 may form a pixel unit. Adjacent may refer to one sub-pixel being next to another sub-pixel in the upper or lower row of the one sub-pixel. Similarly, adjacent may also refer to one sub-pixel being next to another sub-pixel in the left or right column of the one sub-pixel. The pixel units in FIGS. 1 to 6 are marked in dashed boxes.

Consecutive pixel units may form pixel unit rows along the direction of the row axis and pixel unit columns along the direction of the column axis. It should be noted that, the embodiments provided by the present disclosure are merely for exemplifying the arrangement of the pixel structures and should not limit the specific configuration of each pixel or sub-pixel.

Except for the first and/or the last units in a row (i.e., an odd row or an even row), each pixel unit in the row may share a first sub-pixel 10 with an adjacent pixel unit in the same pixel unit row. Except for the first and/or the last units in a column (i.e., an odd column or an even column), each pixel unit in the column may share a first sub-pixel 10 with an adjacent pixel unit in the same pixel unit column. That is, a pixel unit positioned on the edges of the pixel panel may not share a first sub-pixel 10 with any adjacent pixel units. For example, in FIG. 1, the left most first sub-pixel 10 in the first row formed by the first sub-pixels 10 and the third sub-pixel groups 31 may not be shared by two adjacent pixel units, and the left most first sub-pixel 10 in the second row formed by the first sub-pixels 10 and the third sub-pixel groups 31 may be shared by two adjacent pixel units. Thus, whether a first/last first sub-pixel 10 is shared by two adjacent pixel units may be dependent on the position of the first/last first sub-pixel 10 with respect to the first/last third sub-pixel 30 in the same row, i.e., whether the first/last element of the row is a first sub-pixel 10 or a third sub-pixel 30.

For example, the pixel structure provided by the present disclosure may include a first pixel unit 1 and a second pixel unit 2. The first pixel unit 1 may be adjacent to the second pixel unit 2. The first pixel unit 1 and the second pixel unit 2 may each include a first sub-pixel 10, a second sub-pixel 20, and a third sub-pixel 30. The first sub-pixel 10, share by the first pixel unit 1 and the second pixel unit 2, may display a single color. A third sub-pixel group 31 may include two third sub-pixels 30 opposing/facing each other. The third sub-pixel 30 of the first pixel unit 1 may be arranged on one side of the first sub-pixel 10, and the third sub-pixel 30 of the second pixel unit 2 may be arranged symmetrically on the other side of the first sub-pixel 10. The third sub-pixel 30 of the first pixel unit 1 and the third sub-pixel 30 of the second pixel unit 2 may be symmetrical along the direction of the row axis. The second sub-pixels 20 in the first pixel unit 1 and the second pixel units 2 may each be positioned along a diagonal direction with respect to the first sub-pixel 10 and the third sub-pixel 30 in the corresponding pixel unit.

In two adjacent pixel units, each of the two third sub-pixels 30 adjacent to the first sub-pixel 10, shared by the two pixel units, may form a third sub-pixel group 31 with the third sub-pixel 30 of the adjacent pixel unit. The two third sub-pixels 30 forming the third sub-pixel group 31 may be arranged symmetrically along the direction of the vertical axis between the two third sub-pixels 30. For example, the third sub-pixel 30 of the pixel unit 2 may form a third sub-pixel group 31 with the third sub-pixel 30 of the adjacent pixel unit. The first sub-pixels 10 and the third sub-pixel groups 31 may be arranged in an alternating configuration in a row. For example, one first sub-pixel 10 may be arranged between two third sub-pixel groups 31 in a row, and vice versa. In two adjacent pixel units, each second sub-pixel 20 may be positioned between the first sub-pixel 10 and a third sub-pixel group 31. The geometric center of a second sub-pixel 20 may be positioned at the intersection of the perpendicular bisector of the line connecting the geometric centers of the adjacent first sub-pixel 10 and third sub-pixel group 31 in the adjacent (i.e., upper or lower) row and the perpendicular bisector of the line connecting the geometric centers of the adjacent first sub-pixel 10 and third sub-pixel group 31 in the adjacent (i.e., left and right) column.

The third sub-pixels 30 being arranged symmetrically may refer to the two third sub-pixels 30, having the same shapes and sizes, positioned on both sides of the vertical axis of the two third sub-pixels 30. The two third sub-pixels 30 may be completely symmetric to each other along the direction of the vertical axis. The two third sub-pixels 30 may be joined along the direction of the vertical axis to form a pattern of the third sub-pixel group 31 with matching boundaries.

The R, G, and B colors described above may each be the color displayed by one sub-pixel. For example, in the pixel structure of an organic electroluminescent display device, the colors described above may refer to the colors of the light-emitting layer of the organic electroluminescent diodes. When biased normally, the light-emitting layer may emit light with the corresponding color. In the pixel structure of an LCD device, the colors described above may refer to the colors of the CF (Color Filter) layer in the film substrate. When the backlight passes through the CF layer, the backlight is filter by the CF and light with the corresponding color can be displayed.

In the pixel structure described above, geometric centers of the first sub-pixels 10 in consecutive rows and consecutive columns may be aligned to form lines along a diagonal direction different from the directions of the row axis and column axis. Geometric centers of the third sub-pixel groups 31 in consecutive rows and consecutive columns may be aligned to form lines along the diagonal direction different from the directions of the row axis and column axis. The lines, formed by the geometric centers of the first sub-pixels 10 along the diagonal direction, may be parallel to the lines, formed by the geometric centers of the third sub-pixel groups 31 along the diagonal direction. The lines, formed by the geometric centers of the first sub-pixels 10 along the diagonal direction, and the lines, formed by the geometric centers of the third sub-pixel groups 31 along the diagonal direction, may be arranged in an alternating configuration such that one line formed by the geometric centers of the first sub-pixels 10 maybe arranged between two lines formed by the geometric centers of the third sub-pixels 31, and vice versa. The geometric center of a second sub-pixel 20 may be positioned at the intersection of the perpendicular bisector of the line connecting the geometric centers of the adjacent first sub-pixel 10 and third sub-pixel group 31 in the adjacent (i.e., upper or lower) row and the perpendicular bisector of the line connecting the geometric centers of the adjacent first sub-pixel 10 and sub-pixel group 31 in the adjacent (i.e., left and right) column.

Figure 4:
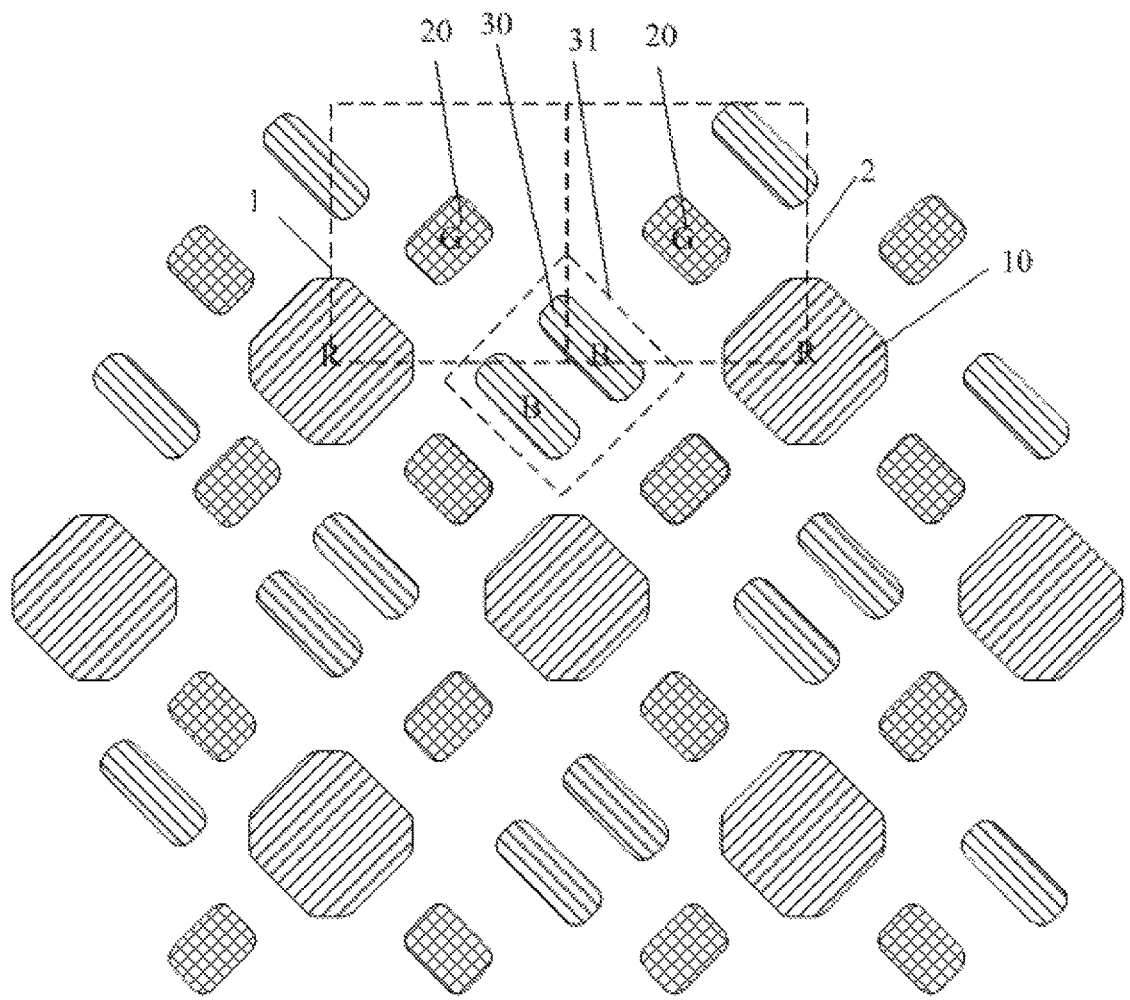
FIG. 4 illustrates schematics of the pixel structure of FIG. 1 of another configuration according to the disclosed embodiments.
Figure 5:
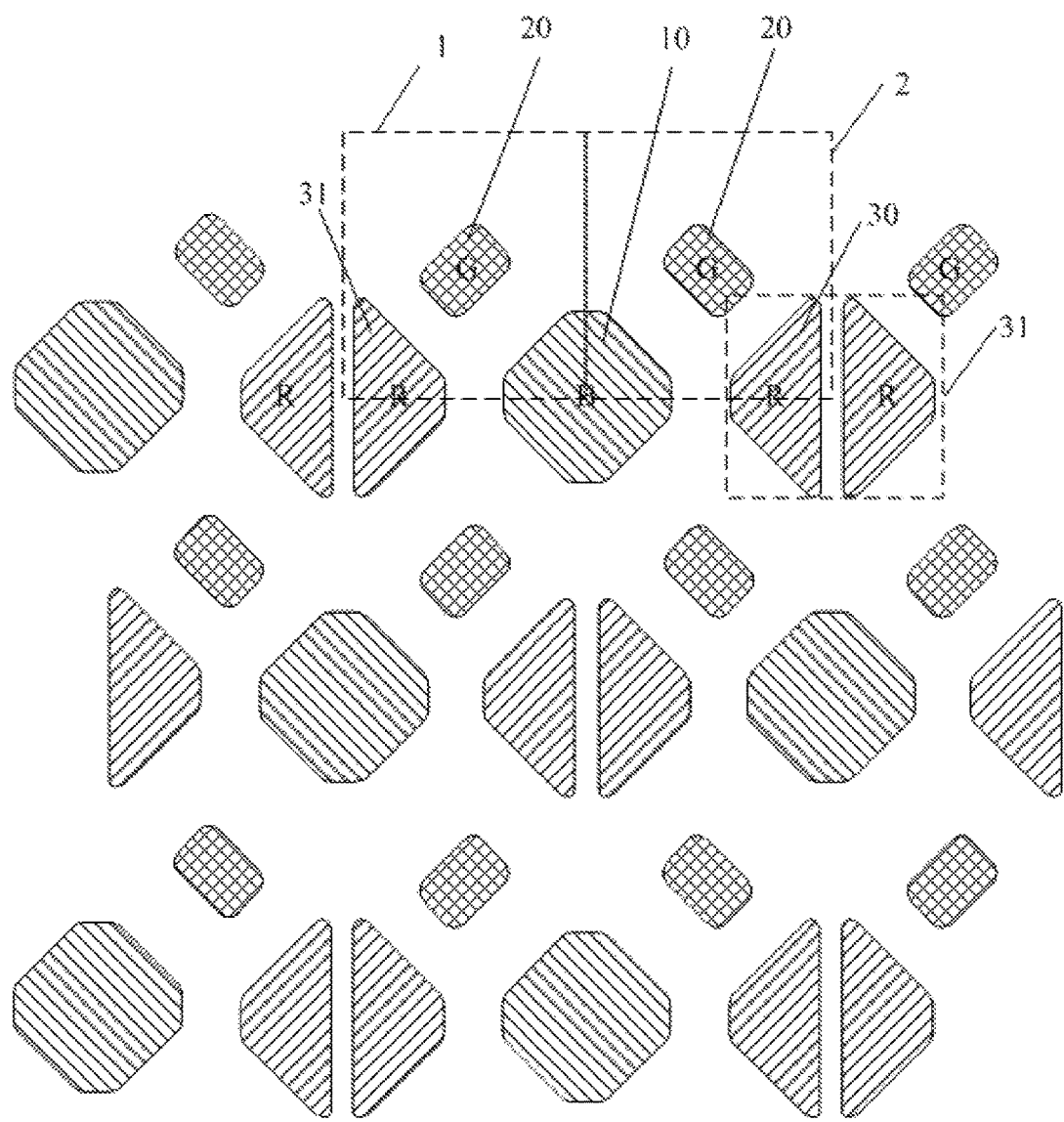
FIG. 5 illustrates schematics of the pixel structure of FIG. 1 of another color configuration according to the disclosed embodiments.

As shown in FIG. 4, the two third sub-pixels 30 of one third sub-pixel group 31 may be arranged between two second sub-pixels 20 along a diagonal direction. The third sub-pixel 30 on one side of a second sub-pixel 20 and the third sub-pixel 30 on the other side of the second sub-pixel 20 may be centrosymmetric about the second sub-pixel 20. The first sub-pixels 10 may form lines along a diagonal direction, and the third sub-pixel groups 31 may form lines along a diagonal direction. A second sub-pixel 20 may be arranged between two first sub-pixels 10 and two third sub-pixel groups 31 such that the second sub-pixel 20 may be arranged between the two adjacent lines formed by the first sub-pixels 10 and between two adjacent lines formed by the third sub-pixel groups 31. Each of the two adjacent second sub-pixels 20 (i.e., separated by one first sub-pixel 10 or one third sub-pixel group 31) may be a mirror image of the other. That is, each of the two adjacent second sub-pixels 20 may be a mirror image of each other about the first sub-pixel 10 or the third sub-pixel group 31 between the two adjacent sub-pixels 20.

It can be shown from FIGS. 1 to 4 that, the first sub-pixels 10 may form consecutive lines along a diagonal direction, and the third sub-pixel groups 31 may form consecutive lines along the diagonal direction. The lines formed by the first sub-pixels 10 may be parallel to the lines formed by the third sub-pixel groups 31. The lines formed by the first sub-pixels 10 and the lines formed by the third sub-pixel groups 31 may be arranged in an alternating configuration such that one line formed by the first sub-pixels 10 may be arranged between two adjacent lines formed by the third sub-pixel groups 31, and vice versa. Each second sub-pixel 20 may be arranged between two adjacent first sub-pixels 10 and between two third sub-pixel groups 31. The two first sub-pixels 10 may be arranged along a diagonal direction and the two third sub-pixel groups 31 may be arranged in a diagonal direction. It should be understood that, it is only required that the line representing the closest distance between two adjacent sub-pixels aligned in a diagonal direction forms an acute angle (i.e., ranging between 0 degrees to 90 degrees) with the row axis (e.g., horizontal direction). In certain embodiments, the acute angle may be 45 degrees. An acute angle of 45 degrees may form more desirable distances between adjacent sub-pixels in the corresponding FMM. The manufacturing process for forming the pixel structure can be improved.

In one embodiment, the first sub-pixels 10 may be arranged in a diagonal direction with an acute angle of 45 degrees or 135 degrees with the row axis. The third sub-pixel groups 31 may be arranged in a diagonal direction with an acute angle of 45 degrees or 135 degrees with the row axis. In two adjacent pixel units, the second sub-pixel 20 may be arranged in a diagonal direction of 45 degrees with respect to the first sub-pixel 10 and the third sub-pixel group 31. For example, the second sub-pixel 20 may be arranged in a direction of 45 degrees along the upper or lower left direction of the first sub-pixel 10/third sub-pixel group 31, or the second sub-pixel 20 may be arranged in a direction of 45 degrees along the upper or lower right direction of the first sub-pixel 10/third sub-pixel group 31.

The geometric centers of the first sub-pixels 10 in a same row/column may be along a same line. The geometric centers of the third sub-pixel groups 31 in a same row/column may be along a same line. The geometric centers of the second sub-pixels 20 in a same row/column may be along a same line. The above arrangement of sub-pixels may simplify the manufacturing process of the pixel structure.

To obtain uniform display effect, the geometric centers of the first sub-pixels 10, the geometric centers of the second sub-pixels 20, and the geometric centers of the third sub-pixel groups 31 may be positioned uniformly. By uniformly positioning the sub-pixels, sub-pixels with different colors can be distributed in the display panel uniformly. Images displayed by the display panel can have improved display quality.

In the pixel structure provided by the present disclosure, the shape of the first sub-pixel 10, the second sub-pixel 20, and the third sub-pixel group 31 may each have axial symmetry. The symmetry axes of the first sub-pixels 10 and the symmetry axes of the third sub-pixel groups 31 may extend in a direction parallel to the direction of the row axis (as shown in FIGS. 1 to 5), parallel to the direction of the column axis (as shown in FIGS. 1 to 5), and/or parallel to a diagonal direction (as shown in FIGS. 1 to 5). The symmetry axes of the second sub-pixels 20 may extend in a direction parallel to the direction of the row axis (as shown in FIGS. 1 to 5), parallel to the direction of the column axis (as shown in FIGS. 1 to 5), and/or parallel to a diagonal direction (as shown in FIGS. 1 to 5). The symmetry axes of the third sub-pixel groups 31 and/or the symmetric axes of the third sub-pixels 30 may extend in a direction parallel to the direction of the row axis (as shown in FIGS. 1 to 4), or parallel to the direction of the column axis (as shown in FIGS. 1 to 4), and/or parallel to a diagonal direction (as shown in FIG. 5). Thus, the first sub-pixels 10, the second sub-pixels 20, and the third sub-pixel groups 31 may form a structure with axes of symmetry. When applying the high-precision FMM to form the pixel structure, the FMM is often stretched along the direction of the row axis or along the direction of the column axis. Since the axes of symmetry of the sub-pixels may be arranged along the direction of the row axis, along the direction of the column axis, and/or along the diagonal direction, the stretching process may not deform the FMM. Thus, the positions of the sub-pixels in the pixel structure can remain accurate.

The shape of the first sub-pixel 10, the third sub-pixel 30, the third sub-pixel group 31, and the second sub-pixel 20 may each be one of a circular shape, a triangular shape, a quadrilateral shape, a pentagonal shape, a hexagonal shape, and/or an octagonal shape. The shapes of the sub-pixels may be determined based on manufacturing/design requirements. In one embodiment, the first sub-pixel 10 may have a quadrilateral shape or an octagonal shape, and the third sub-pixel 30 may have a triangular shape or a quadrilateral shape. Two adjacent third sub-pixels 30 may form the third sub-pixel group 31, and the overall shape of the third sub-pixel group 31 may be quadrilateral or octagonal. The second sub-pixel 20 may have a quadrilateral shape or an octagonal shape. In practice, the shapes of the sub-pixels can be determined flexibly based on the application, requirements on the display effect, etc.

In the pixel structures shown in FIG. 1 and FIGS. 2 to 4 (modified from FIG. 1), a first sub-pixel 10 may have a rhombus shape, and a third sub-pixel 30 may have an isosceles triangle shape. A third sub-pixel group 31, formed by two adjacent third sub-pixels 30, may have an overall rhombus shape. A second sub-pixel 20 may have a rectangular shape.

The pixel structure of FIG. 5 may be modified from the pixel structure of FIG. 1. In FIG. 5, the first sub-pixel 10 may have a rhombus shape, and the third sub-pixel 30 may have a rectangular shape. The third sub-pixel group 31, formed by two adjacent third sub-pixels 30, may have an overall quadrilateral shape. The second sub-pixel 20 may have a rectangular shape.

As described above, the shapes and arrangement of the sub-pixels in a pixel unit can have many variations according to manufacturing/design requirements. For example, the shapes and arrangement of the sub-pixels can be determined flexibly according to the application of the display panel or according to the requirements from clients. In addition, because of the wiring process and the manufacturing of masks in the manufacturing process, certain angles of the sub-pixels may be chamfered. For a first sub-pixel 10, the turning angles of the rhombus may be chamfered. For a third sub-pixel 30, the apex angle of the isosceles triangle or the turning angles of the rectangle may be chamfered. For a second sub-pixel 20, the turning angles of the rectangle may be chamfered. The above shapes and arrangement of the sub-pixels may improve independent color display of the sub-pixels.

It is noted that, the distance/spacing between any two sub-pixels may be adjusted or modified according to manufacturing/design requirements to ensure that the display panels, containing the sub-pixels, display colors and images accurately.

In certain embodiments, the areas of the sub-pixels of the pixel structure described above can be determined below. For example, the area of the first sub-pixel 10 may be the same as the area of the third sub-pixel group 31, and the area of the second sub-pixel 20 may be less than the area of the first sub-pixel 10. Alternatively, in certain other embodiments, the area of the third sub-pixel group 31 may be less than the area of the first sub-pixel 10, and the area of the first sub-pixel 10 may be greater than the area of the second sub-pixel 20.

For example, the first sub-pixel 10, the second sub-pixel 20, and the third sub-pixel group 31 may each display any one of the red (R), green (G), and blue (B) colors such that the display panel can display full-color images. In one embodiment, in the pixel structures of FIGS. 1 to 4, the first sub-pixels 10 may display R, the second sub-pixels 20 may display G, and the third sub-pixel groups 31 may display B. In the pixel structures in FIGS. 1 to 4, the sub-pixels displaying R may be shared by adjacent pixel units, and the two sub-pixels displaying B may be adjacent to each other. In FIG. 5, the first sub-pixels 10 may display B, the second sub-pixels 20 may display G, and the third sub-pixel groups 31 may display R. In the pixel structure in FIG. 5, the two sub-pixels display R may be adjacent to each other, the sub-pixels display B may be shared by adjacent pixel units.

In the pixel structures described above, by sharing the two sub-pixels displaying R by adjacent pixel units or arranging the two sub-pixels displaying R to be adjacent to each other, or by sharing the two sub-pixels displaying B by adjacent pixel units or arranging the two sub-pixels displaying B to be adjacent to each other, the risk of color mixing among sub-pixels displaying different colors may be reduced. Meanwhile, areas between sub-pixels, i.e., the areas with no light emission, can be reduced.

The pixel structure described above may be used in OLED display devices and/or LED devices. That is, the pixel structure in the embodiments of the present disclosure may be used in OLED display devices, LCD display devices, and/or other suitable devices containing pixel structures such as digital cameras, plasma display devices.

Particularly, in OLED display devices, since the materials for emitting blue light often has a lower emission efficiency and a shorter lifespan compared to the materials for emitting red light and green light, the area of a sub-pixels for displaying blue may be larger than the area of a sub-pixel for displaying red and the area of a sub-pixel for displaying green. In addition, since human eye is more sensitive to green color, and the material for emitting green light may have the highest emission efficiency, a sub-pixel for displaying green may have the smallest area. That is, the area of the second sub-pixel 20 may be smaller than the areas of both the first sub-pixel 10 and the third sub-pixel group 31. Meanwhile, the sub-pixels for displaying green, easier to be identified by human eye, may be distributed uniformly in the directions of row axis and column axis to ensure desirable display quality along the directions of row axis and column axis.

For manufacture LCD display devices, the first sub-pixels 10, the second sub-pixels 20, and the third sub-pixel groups 31 may be formed through a patterning process. For manufacturing OLED display devices, the first sub-pixels 10, the second sub-pixels 20, and the third sub-pixels 30 may be formed through a deposition process. The patterning process may include a photolithography process, or include a photolithography process and corresponding etching steps. The patterning process may also include printing, inkjet printing, and/or other process for forming predetermined patterns. The photolithography process may refer to the steps including film formation, exposure, and/or development. By applying appropriate photoresist, masks, and/or exposure apparatus, patterns can be formed through the photolithography process. The deposition process, i.e., the vacuum coating process, may be referred as the process of evaporating/subliming the material/substance for forming the film and depositing the evaporated/sublimed material/substance on the surface of the substrate/device. To form a certain pattern, the FMM can be applied on the surface of the substrate/device such that the evaporated/sublimed material/substance may not be formed in the areas covered by the FMM. Based on the pixel structure to be formed, appropriate processes can be selected to form the pattern of the pixel structure.

Particularly, for OLED display devices, the first sub-pixels 10, the second sub-pixels 20, and the third sub-pixel groups 31 may correspond to the openings in the FMM. The limit on the distance/spacing between two openings in the FMM may be applied on a diagonal direction (e.g., 45 degrees) to increase the density of the sub-pixels and improve the display resolution. For example, the resolution of greater than 300 ppi (pixels per inch) can be achieved by embodiments of the present disclosure. In the manufacturing process of OLED display devices, since the distance between two sub-pixels may represent the distance in a diagonal direction, the distance between to sub-pixels may be increased such that it is easier to apply FMM to form the pattern of sub-pixels. The pattern may correspond to the areas on the FMM with openings to form the sub-pixels. The distance/spacing between the openings (i.e., along a diagonal direction) in the FMM as described above may be much greater than the distance/spacing between the openings (i.e., along the row axis or column axis) in a conventional FMM. By using the FMM as described above, a pixel structure with higher resolution may be obtained. Further, since the two third sub-pixels 30 may display the same color, in the manufacturing process, certain structures, e.g., the light emitting layer, may be formed in one step. Independent display can be obtained by driving the sub-pixels independently. The arrangement/design as described above may further simplify the manufacturing process of the pixel structures and improve the display resolution by the pixel structure.

Meanwhile, by arranging the blue or red sub-pixel in one pixel unit to be adjacent to the blue or red sub-pixel in an adjacent pixel unit, i.e., the blue (or red) sub-pixel of one pixel unit is positioned adjacent to the blue (or red) sub-pixel of an adjacent pixel unit, two adjacent pixel units may share a first sub-pixel 10. Thus, five sub-pixels can have the same display effect as six sub-pixels. The arrangement described above may also reduce the areas between sub-pixels, i.e., the areas with no light emission, such that the aperture ratio can be increased, for example, to about 42%. When the display resolution of the pixel structure is high, the arrangement/configuration described above may ensure desirable aperture ratio.

Figure 7:
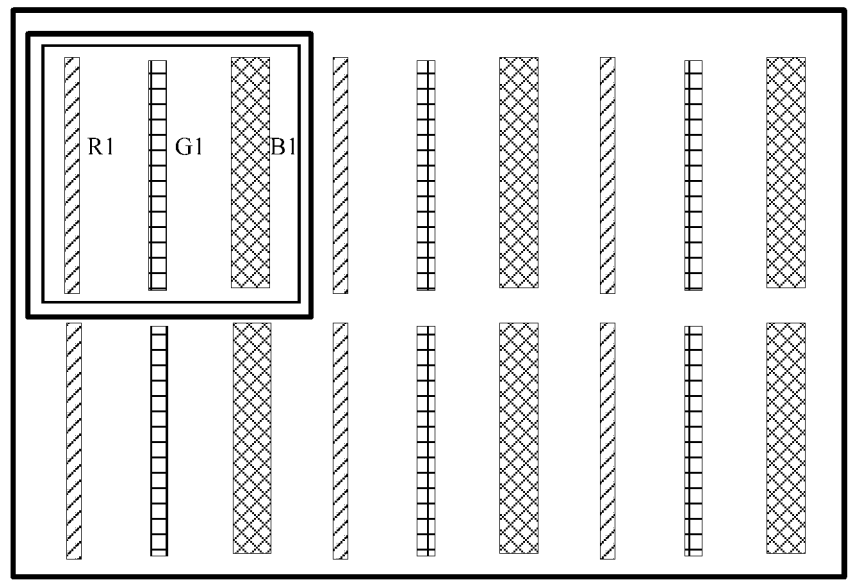
FIGS. 7-9 illustrate schematics of conventional pixel structures.
Figure 8:
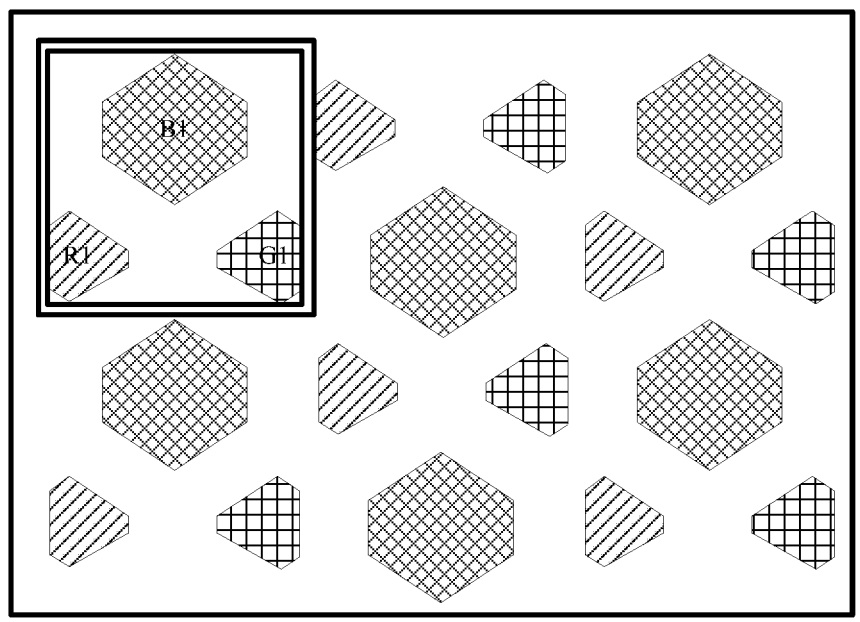
Figure 9:
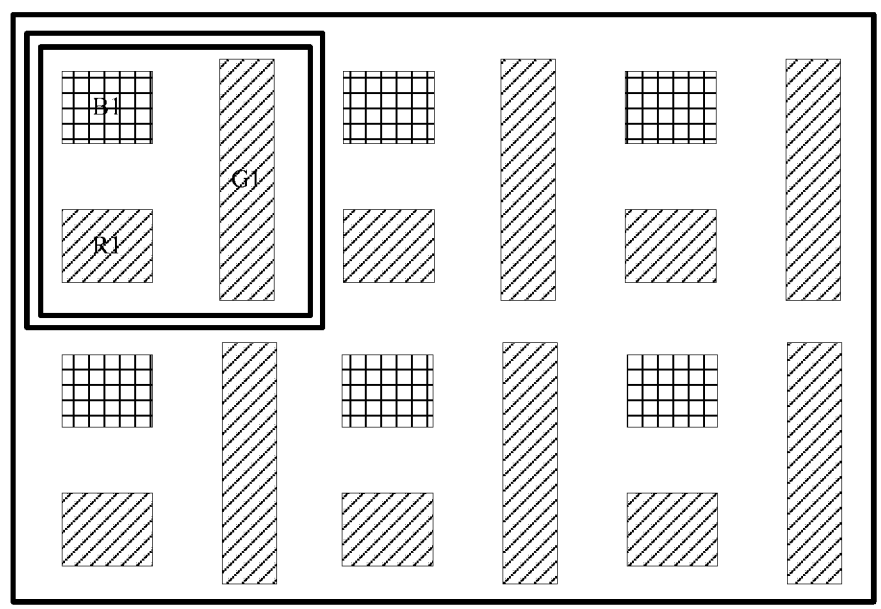

For example, the conventional pixel structure illustrated in FIG. 7 often has a display resolution of 200 ppi and an aperture ratio of about 20% to about 30%, the conventional pixel structure illustrated in FIG. 8 often has a display resolution of 300 ppi and an aperture ratio of about 37%, and the conventional pixel structure illustrated in FIG. 9 often has a display resolution of less than 300 ppi and an aperture ratio of about 30% to about 35%. In FIGS. 7-9, B1 represents blue color, G1 represents green color, and R1 represents red color. The disclosed pixel structure increases the density of sub-pixels and increases display resolution (e.g., often higher than 300 ppi). Meanwhile, in the disclosed pixel structure, the sub-pixels for displaying blue may be next to the sub-pixels for displaying red, and areas between adjacent sub-pixels (i.e., the areas having no light illumination) can be reduced. Thus, the aperture ratio of the disclosed pixel structure can be about 42%. Also, sub-pixels displaying green, easier to be distinguished by human eyes, may be arranged/aligned uniformly in rows and in columns on the display panel, so that display quality along the horizontal direction and along the vertical direction may be ensured. In addition, by sharing sub-pixels displaying blue in adjacent pixels, five sub-pixels may have the same display effect as six sub-pixels. The display products can have improved product lifespan and display brightness.

In one embodiment, the distance between the two openings in the FMM corresponding to the sub-pixels for displaying the three primary colors (i.e., red, green, and blue colors) may all be increased. The arrangement/configuration described above may make the design of FMM easier. The deposition process to form the organic layer may also be easier. Higher resolution can be easier to obtain. It is understandable that, compared to conventional pixel structures, as shown in FIGS. 7 to 9, with three sub-pixels in one pixel unit, the pixel structure provided in the present disclosure can obtain the display effect of two pixel units (i.e., six sub-pixels) by only using five sub-pixels. The manufacturing process for forming the pixel structure can be greatly simplified, and the pixel structure can be easier to form by using the FMM.

Further, the pixel structures provided in the present disclosure may receive display data/information through data lines. The first sub-pixels 10, the second sub-pixels 20, and the third sub-pixels 30 may display colors independently. For example, a first sub-pixel 10, a second sub-pixel 20, and a third sub-pixel 30 may each be connected to one data line to receive display data/information. Since a first sub-pixel 10 may be shared by a first pixel unit 1 and a second pixel unit 2, only one data line is required for one first sub-pixel 10 to be shared by two pixel units. By the arrangement/configuration described above, five sub-pixels can obtain the same display effect of six sub-pixels. The number of data lines used in the pixel structure can be reduced accordingly and back panel wiring for the data lines can be easier.

Embodiments of the present disclosure also provide a pixel structure. By optimizing and arrangement of the sub-pixels (i.e., the R, G, and B sub-pixels), the line connecting the geometric centers of two adjacent sub-pixels of different colors may form an angle of 45 degrees with the horizontal line (i.e., the row axis). The angle of 45 degrees may represent an optimized design. The arrangement described above may enable five sub-pixels to have the display effect of six sub-pixels and improve the aperture ratio of the sub-pixels. The aperture ratio of the display device can be improved, and the display brightness of the pixel structure in a display device can also be improved accordingly. The lifespan of the OLED display panel that contains the pixel structure disclosed can be improved.

Further, since a first sub-pixel may be shared by two adjacent pixel units, only one data line is required for one first sub-pixel. The number of data lines used in the pixel structure is reduced accordingly. Compared to conventional pixel structures, with the same number of pixel units used in a pixel structure, the number of data lines used in the pixel unit provided by the present disclosure may be fewer. The display device incorporating the pixel structure provided in the present disclosure may have lower power consumption.

The pixel structure provided in the present disclosure may be suitable for manufacturing side-by-side top-emission AMOLED display panel. The side-by-side top-emission AMOLED display panel may be formed through a deposition process by applying the FMM on the surface of substrate/device.

The present disclosure further provides a method for displaying the pixel structure described above. In the pixel structure, two adjacent pixel units share one first sub-pixel to display colors such that five sub-pixels can have the same display effect as six sub-pixels. By applying the configuration/arrangement described above, the two adjacent pixel units can both display pixel information of the three colors (i.e., R, G, and B colors).

Specifically, in the pixel structure provided by the present disclosure, a second sub-pixel 20, an adjacent third sub-pixel 30 in an adjacent row, and an adjacent first sub-pixel 10 in the adjacent row may form a pixel unit. Except for the first pixel unit and/or the last pixel unit in the odd rows (or even rows), each pixel unit may share the first sub-pixel 10 with an adjacent pixel unit in the same pixel unit row. Alternatively, the second sub-pixel 20, an adjacent third sub-pixel 30 in an adjacent column, and an adjacent first sub-pixel 10 in the adjacent column may form a pixel unit. Except for the first pixel unit and/or the last pixel unit in the odd columns (or even columns), each pixel unit may share the first sub-pixel 10 with an adjacent pixel unit in the same pixel unit column. Using configurations described above, each pixel unit can display pixel information of the three colors (i.e., R, G, and B colors).

Figure 6:
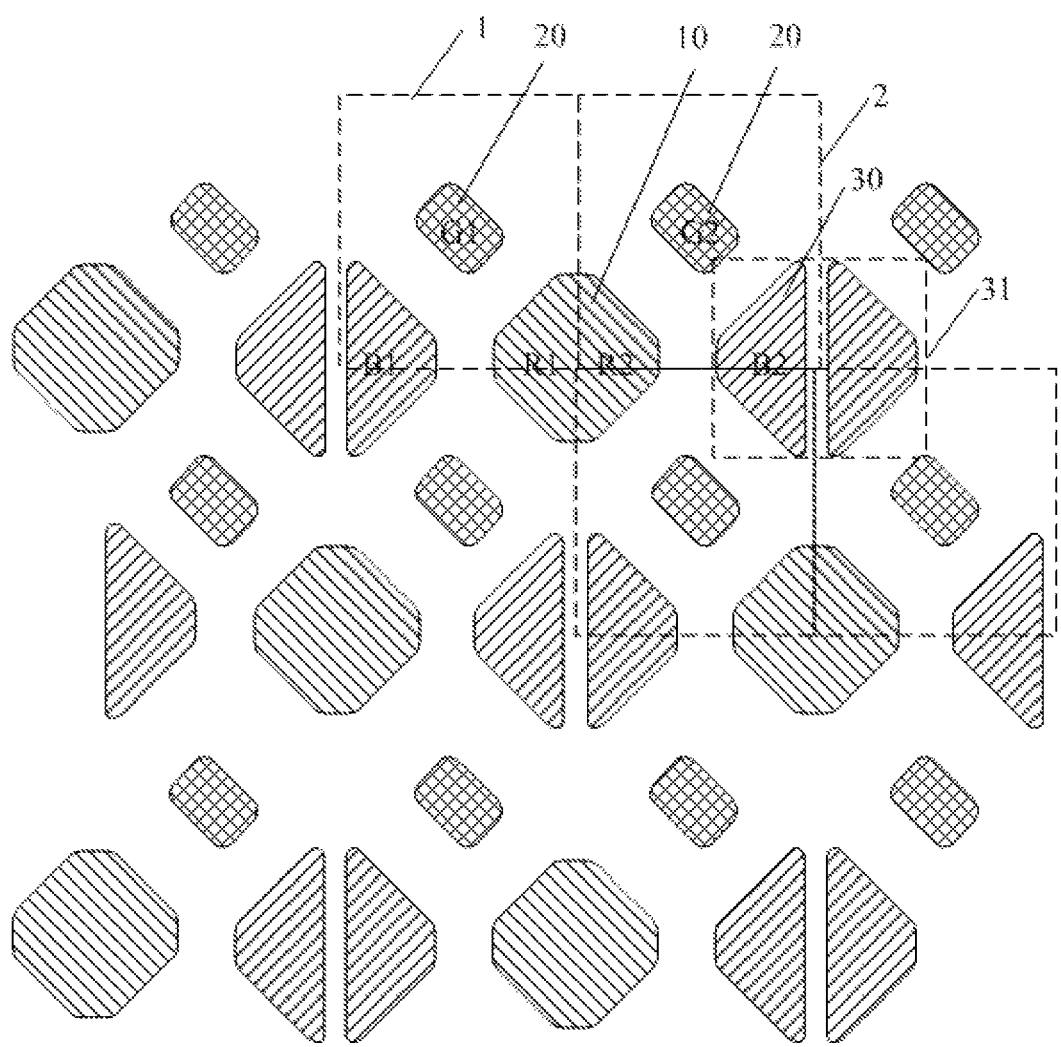
FIG. 6 illustrates schematics of another exemplary pixel structure according to the disclosed embodiments.

The pixel structure of FIG. 6 may correspond to the pixel structure in FIG. 1. In FIG. 6, the sub-pixels for displaying red may be the first sub-pixels 10. For example, the calculation of the brightness value of the first sub-pixels 10 is described below. The actual brightness value of a first sub-pixel 10, shared by the first pixel unit 1 and the adjacent second pixel unit 2, may be calculated as a weighted sum of the required theoretical brightness value of the red color displayed by the first sub-pixel 10 shared by the first pixel unit 1 and the required theoretical brightness value of the red color displayed by the first sub-pixel 10 shared by the second pixel unit 2. Similarly, the actual brightness values of the sub-pixels of the pixel structures of FIGS. 2 to 4, modified from the pixel structure of FIG. 1, can also be calculated using the method described above. Meanwhile, the actual brightness value of the sub-pixels 10 for displaying blue in the pixel structure of FIG. 5 can be calculated the same way as the actual brightness value for the sub-pixels 10 for displaying red in the pixel structure of FIG. 1.

As shown in FIG. 6, the first sub-pixel 10 shared by two adjacent pixel units may be labeled as R1 and R2. The R1 portion of the first sub-pixel 10 may be in the first pixel unit 1, and the R2 portion of the first sub-pixel 10 may be in the second pixel unit 20. The second sub-pixel 20 in the first pixel unit 1 may be labeled as G1, and the second sub-pixel 20 in the second pixel unit 2 may be labeled as G2. The third sub-pixel 30 in the first pixel unit 1 may be labeled as B1, and the third sub-pixel 30 in the second pixel unit 2 may be labeled as B2. The sub-pixels with the same labeling number (i.e., 1 or 2) may form a display color gamut. For example, R1, G1, and B1 may form a display color gamut. R2, G2, and B2 may form another display color gamut. The color of the display color gamut, formed by mixing the colors of the sub-pixels, may represent the display information of the display color gamut.

When displaying an image, a data source for providing the pixel display information may input/send pixel display information to each pixel unit. The pixel display information may include color information for displaying the R, G, and B colors. The method for displaying colors using the pixel structure may include the following steps.

In step S1, the pixel structure may obtain the theoretical brightness values from the pixel display information for the colors displayed by the first sub-pixel 10, the second sub-pixel 20, and the third sub-pixel 30 of each pixel unit.

In step S1, the pixel structure may obtain the theoretical brightness values from the pixel display information for the colors displayed by the first sub-pixel 10, the second sub-pixel 20, and the third sub-pixel 30 of the first pixel unit 1. The pixel structure may also obtain the theoretical brightness values from the pixel display information for the colors displayed by the first sub-pixel 10, the second sub-pixel 20, and the third sub-pixel 30 of the second pixel unit 2. According to the working principle of pixel driving chips for display panels, a driving chip may separate, amplify, and correct the pixel display information to obtain display information for the three colors (R, G, and B colors). The driving chip may further obtain the brightness signals for the three colors through appropriate matrix transformation calculation. The brightness signals for the three colors may correspond to the theoretical brightness values of the three colors. Any suitable means for separating brightness information in conventional pixel structure manufacturing can be used to separate the brightness signals described above and the details are omitted herein.

In step S2, the pixel structure may calculate the actual brightness values of the first sub-pixel 10, the second sub-pixel 20, and the third sub-pixel 30 of each pixel unit.

In step S2, the pixel structure may calculate the actual brightness value of the first sub-pixel 10, the second sub-pixel 20, and the third sub-pixel 30 of the first pixel unit 1. The pixel structure may also calculate the actual brightness value of the first sub-pixel 10, the second sub-pixel 20, and the third sub-pixel 30 of the second pixel unit 2. The actual brightness value of the second sub-pixels 20 may be the theoretical brightness values of the color displayed by the second sub-pixels 20. The actual brightness values of the third sub-pixels 30 may also be the theoretical brightness value of the color displayed by the third sub-pixels 30. The actual brightness value of the first sub-pixel 10, shared by the first pixel unit 1 and the adjacent second pixel unit 2, can be calculated as a sum of the weighted theoretical brightness value of the color displayed by the first sub-pixel 10 in the first pixel unit 1 and the weighted theoretical brightness value of the color displayed by the first sub-pixel 10 in the second pixel unit 2.

Since each first sub-pixel 10 may be shared by two adjacent pixel units for displaying colors, the input data signal to the first sub-pixel 10 may be a weighted sum of the pixel display data for the first sub-pixel 10 of the first pixel unit 1 and the pixel display data for the first sub-pixel 10 of the second pixel unit 2. In one embodiment, the actual brightness value of the first sub-pixel 10, may be a sum of the weighted theoretical brightness values of the first sub-pixels 10 shared by adjacent pixel units. The weighted theoretical brightness value may represent the product of the theoretical brightness value and the relative weight corresponding to the theoretical brightness value. When the first sub-pixel 10 is shared by two adjacent pixel units, the relationship representing the weighted sum and relative weights described above can be H=Ax+By, where A and B are the relative weights of the sub-pixels for displaying the same color in the two adjacent pixel units. The values of A and B satisfies A+B=1. H represents the actual brightness value of the sub-pixel, i.e., the weighted sum.

In some embodiments, the relative weight corresponding to the theoretical brightness value of color displayed by the first sub-pixel 10 of the first pixel unit 1 may be ½. The relative weight corresponding to the theoretical brightness value of color displayed by the first sub-pixel 10 of the second pixel unit 1 may also be ½. For example, a first sub-pixel 10 may display red or blue. The input signal to the first sub-pixel 10 may be a sum of the weighted pixel display information (i.e., red or blue) displayed by the first pixel 10 shared by the first pixel unit 1 and by the first pixel 10 shared by the second pixel unit 2. The weighted pixel display information may represent the product of the weighted pixel display information for red/blue color and the corresponding relative weight, where the relative weight is ½ for the first sub-pixel 10 of the first pixel unit 1 and for the first sub-pixel 10 of the second pixel unit 2. It should be understood that, the overall display effect of images (e.g., bright or dark), generated based on the pixel display information corresponding to the images, can be adjusted through adjusting the values of the relative weights. Desirable display brightness can be obtained by selecting suitable values of relative weights for generating desirable weighted sum.

In step S3, the pixel structure may input the corresponding actual brightness values into the first sub-pixel 10, the second sub-pixel 20, and the third sub-pixel 30 of each pixel unit to display images using the three primary colors (i.e., R, G, and B colors).

In step S3, the actual brightness values of the first sub-pixels 10, the second sub-pixels 20, and the third sub-pixels 30 may be outputted through step S2. The actual brightness values may be sent to the corresponding sub-pixels to display images.

As shown in the pixel structure of FIG. 1, each sub-pixel may be connected to a data line. The actual brightness values of the first sub-pixels 10, the second sub-pixels 20, and the third sub-pixels 30, generated through step S2, may be sent/transported to the corresponding sub-pixels through the data lines connected to the sub-pixels.

By illustrating the method for displaying the pixel structure of FIG. 1 as mentioned above, the calculation of the actual brightness values of the sub-pixels is also described. Display color gamut formed by the color mixing of the sub-pixels in a pixel unit is further described. It is understandable that, a single row/column of first sub-pixels may exist on the edge of the pixel structure, and the first sub-pixels in the single row/column may not form a pixel unit (e.g., containing three sub-pixels) with adjacent sub-pixels. By applying an appropriate edge detection algorithm, desirable display effect can be obtained. The processing of the sub-pixels on the edge of the pixel structure is not limited by the embodiments of the present disclosure.

By applying the method for displaying the pixel structure, five sub-pixels can have the same display effect as six sub-pixels through simple a pixel sharing algorithm. Accordingly, the number of data lines used in the pixel structure can be reduced and back panel wiring for the data lines can be easier.

Another aspect of the present disclosure provides a display apparatus. The display apparatus contains the pixel structure as described above and the method for displaying the pixel structure.

The display apparatus can be an LED panel, an electronic paper, an OLED display panel, a mobile phone, a tablet, a TV, a monitor, a laptop, a digital photo frame, a navigation device, or any product or device with display functions.

Because of the improved deposition process, the process for forming the pixel structure incorporated in the display apparatus may have higher manufacturing yield. In addition, since improved brightness and color uniformity are achieved by the pixel structure, the display apparatus may have improved display effect.

The present disclosure provides a pixel structure and a method for displaying the pixel structure. By improving the pixel structure, higher aperture ratio and higher resolution can be obtained. The brightness of the pixel structure can be improved and the display effect of the display apparatus containing the pixel structure can be improved accordingly. Meanwhile, the method for displaying the pixel structure can enable proper image display. Back panel wiring for the data lines may be easier and the power consumption of the display apparatus may be reduced. The pixel structure and method provided by the present disclosure provide a technical solution for the problems existing in conventional display apparatuses. Particularly, the pixel structure and the method disclosed provide solution to overcome the difficulty in improving the display resolution in OLED display apparatuses due to limitations in the manufacturing process.

It should be understood that the above embodiments disclosed herein are exemplary only and not limiting the scope of this disclosure. Without departing from the spirit and scope of this invention, other modifications, equivalents, or improvements to the disclosed embodiments are understandable to those skilled in the art and are intended to be encompassed within the scope of the present disclosure.

What is claimed is:

1. A pixel structure, comprising first sub-pixels, second sub-pixels, and third sub-pixels, wherein:
   two adjacent third sub-pixels facing each other form a third sub-pixel group;
   the second sub-pixels are arranged in a row along a first axis to form second-sub-pixel rows, all of the first sub-pixels and the third sub-pixel groups are arranged in an alternating configuration along the direction of the first axis parallel to the second-sub-pixel rows, and the second-sub-pixel rows and rows formed by the first sub-pixels and the third sub-pixel groups are arranged in an alternating configuration;
   the second sub-pixels are arranged along a direction of a second axis to form second-sub-pixel columns, the first sub-pixels and the third sub-pixel groups are arranged in an alternating configuration along the direction of the second axis parallel to the second-sub-pixel columns, the second-sub-pixel columns and columns formed by the first sub-pixels and the third sub-pixel groups are arranged in an alternating configuration;
   geometric center of each second sub-pixel is positioned on a perpendicular bisection of a line connecting centers of any two of third sub-pixel groups and first sub-pixels adjacent to the second sub-pixel;
   the first axis is different from the second axis; and
   an entire area of the first sub-pixel is same as an entire area of the third sub-pixel group comprising the two adjacent third sub-pixels, and an area of the second sub-pixel is less than the area of the first sub-pixel.

2. The pixel structure according to claim 1, wherein:
   the second sub-pixel, an adjacent third sub-pixel group in an adjacent row, and an adjacent first sub-pixel in the adjacent row form a pixel unit, consecutive pixel units forming pixel unit rows aligned along the direction of the first axis, and except for a pixel unit at an edge of the pixel unit row, each pixel unit sharing the first sub-pixel with an adjacent pixel unit in a same pixel unit row; or
   the second sub-pixel, an adjacent third sub-pixel group in an adjacent column, and an adjacent first sub-pixel in the adjacent column form a pixel unit, consecutive pixel units forming pixel unit columns aligned along the direction of the second axis, and except for a pixel unit at an edge of the pixel unit column, each pixel unit shares the first sub-pixel with an adjacent pixel unit in a same pixel unit column.

3. The pixel structure according to claim 1, wherein:
   a diagonal direction is 45 degrees clockwise with the direction of the first axis, 45 degrees counter clockwise with the direction of the first axis, 45 degrees clockwise with the direction of the second axis, or 45 degrees counter clockwise with the direction of the second axis;
   geometric centers of the first sub-pixels in consecutive rows or consecutive columns are aligned to form lines along one of the diagonal directions;
   geometric centers of the third sub-pixel groups in consecutive rows or consecutive columns are aligned to form lines along a diagonal direction parallel to lines formed by the geometric centers of the first sub-pixels such that the lines formed by the geometric centers of the first sub-pixels and lines formed by the geometric centers of third sub-pixel groups are arranged in an alternating configuration;
   each second sub-pixel is aligned between two adjacent first sub-pixels or between two adjacent third sub-pixel groups, wherein the two adjacent first sub-pixels are aligned in one of the diagonal direction and the two adjacent third sub-pixel groups are aligned in another one of the diagonal direction; and
   a geometric center of each second sub-pixel is arranged at an intersection of a perpendicular bisector of a line connecting geometric centers of adjacent first sub-pixel and third sub-pixel group in an adjacent row and a perpendicular bisector of a line connecting geometric centers of adjacent first sub-pixel and third sub-pixel group in an adjacent column.

4. The pixel structure according to claim 3, wherein:
   each of the two third sub-pixels in the third sub-pixel group is a mirror image of the other along the direction of the first axis or along the direction of the second axis, each third sub-pixel group being arranged between two first sub-pixels along the direction of the first axis or along the direction of the second axis, and two adjacent third sub-pixels being arranged on both sides of the first sub-pixel, wherein each of the two adjacent third sub-pixels has a shortest distance to the first sub-pixel along the direction of the first axis or along the direction of the second axis such that the two adjacent third sub-pixels have a mirror symmetry, a centrosymmetry, or a combination of a mirror symmetry and a centrosymmetry about a geometric center of the first sub-pixel; or
   each third sub-pixel group is arranged between two adjacent second sub-pixels along a diagonal direction such that each second sub-pixel is arranged between two adjacent third sub-pixel groups along the diagonal direction, the two adjacent third sub-pixels having a mirror symmetry, a centrosymmetry, or a combination of a mirror symmetry and a centrosymmetry about a geometric center of the second sub-pixel.

5. The pixel structure according to claim 4, wherein:
   a shape of the first sub-pixel, a shape of the third sub-pixel group, and a shape of the second sub-pixel each has a symmetry axis; and
   a symmetry axis of the shape of the first sub-pixel extends along a direction parallel to one of the first axis, second axis, and diagonal axis, a symmetry axis of the shape of the third sub-pixel group extends along a direction parallel to one of the first axis, second axis, and diagonal axis, and a symmetry axis of the shape of the second sub-pixel extends along a direction parallel to one of the first axis, second axis, and diagonal axis.

6. The pixel structure according to claim 5, wherein:
   the lines formed by the geometric centers of the first sub-pixels are arranged along a direction of 45 degrees or 135 degrees with the first axis;
   the lines formed by the geometric centers of the third sub-pixel groups are arranged along a direction of 45 degrees or 135 degrees with the first axis; and
   the lines formed by the geometric centers of the second sub-pixels are arranged along a direction of 45 degrees or 135 degrees with the first axis.

7. The pixel structure according to claim 1, wherein:
   each of the shape of the first sub-pixel, the shape of the third sub-pixel, the shape of the third sub-pixel group, and the shape of the second sub-pixel is a circular shape, a triangular shape, a quadrilateral shape, a pentagonal shape, a hexagonal shape, an octagonal shape, or a combination thereof.

8. The pixel structure according to claim 7, wherein:
the first sub-pixel has a quadrilateral shape or an octagonal shape;
the third sub-pixel has a triangular shape or a quadrilateral shape such that the third sub-pixel group formed by two adjacent third sub-pixels facing each other has a quadrilateral shape or an octagonal shape; and
the second sub-pixel has a quadrilateral shape or an octagonal shape.

9. The pixel structure according to claim 8, wherein:
the first sub-pixel has a rhombus shape;
the third sub-pixel has a rectangular shape such that the third sub-pixel group formed by two adjacent third sub-pixels facing each other has an overall quadrilateral shape; and
the second sub-pixel has a rectangular shape.

10. The pixel structure according to claim 8, wherein:
two adjacent second sub-pixels having a closest distance along the direction of the first axis or the direction of the second axis have same shapes, or
two adjacent second sub-pixels having a closest distance along the direction of the first axis or the direction of the second axis have a mirror symmetry about a perpendicular bisector of a line connecting geometric centers of the two adjacent second sub-pixels.

11. The pixel structure according to claim 2, wherein:
geometric centers of the first sub-pixels in one row or in one column are aligned in a straight line;
geometric centers of the third sub-pixel groups in one row or in one column are aligned in a straight line; and
geometric centers of the second sub-pixels in one row or in one column are aligned in a straight line.

12. The pixel structure according to claim 1, wherein:
each of the first sub-pixel, the second sub-pixel, and the third sub-pixel group is connected to a data line to receive pixel display information.

13. A method for displaying the pixel structure according to claim 1, wherein:
the second sub-pixel, an adjacent third sub-pixel in an adjacent row, and an adjacent first sub-pixel in the adjacent row form a pixel unit, consecutive pixel units forming pixel unit rows aligned along the direction of the first axis, and except for a pixel unit at an edge of the pixel unit row, each pixel unit sharing the first sub-pixel with an adjacent pixel unit in a same pixel unit row such that each pixel unit displays pixel display information of three display colors, or
the second sub-pixel, an adjacent third sub-pixel in an adjacent column, and an adjacent first sub-pixel in the adjacent column form a pixel unit, consecutive pixel units forming pixel unit columns aligned along the direction of the second axis, and except for a pixel unit at an edge of the pixel unit column, each pixel unit sharing the first sub-pixel with an adjacent pixel unit in a same pixel unit column such that each pixel unit displays pixel display information of the three display colors.

14. The method according to claim 13, further including steps of:
step S1, obtaining theoretical brightness values from the pixel display information for colors displayed by the first sub-pixel, the second sub-pixel, and the third sub-pixel of each pixel unit;
step S2, calculating actual brightness values of the first sub-pixel, the second sub-pixel, and the third sub-pixel 30 of each pixel unit; and
step S3, inputting corresponding actual brightness values into the first sub-pixel, the second sub-pixel, and the third sub-pixel of each pixel unit to display images.

15. The method according to claim 14, wherein:
the actual brightness value of the color displayed by the second sub-pixels is a theoretical brightness value of color displayed by the second sub-pixel;
the actual brightness value of the color displayed by the third sub-pixel is a brightness theoretical value of displayed by the third sub-pixel; and
the actual brightness value of the color displayed by the first sub-pixel is calculated as a sum of a weighted brightness value of color displayed by a first portion of the first sub-pixel and a weighted brightness value of color displayed by a second portion of the first sub-pixel, wherein the first portion of the first sub-pixel is in a first pixel unit and the second portion of the first sub-pixel is in a second pixel unit adjacent to the one pixel unit.

16. The method according to claim 15, wherein:
a relative weight value multiplied by the brightness value of the color displayed by the first portion of the first sub-pixel is ½; and
a relative weight value multiplied by the brightness value of the color displayed by the second portion of the first sub-pixel is ½.

17. A display apparatus, including the pixel structure of claim 1.

18. The display apparatus according to claim 17, wherein the display apparatus is an OLED display device, an LCD device.

* * * * *